United States Patent
Kelly et al.

(10) Patent No.: US 9,136,159 B2
(45) Date of Patent: Sep. 15, 2015

(54) METHOD AND SYSTEM FOR A SEMICONDUCTOR FOR DEVICE PACKAGE WITH A DIE-TO-PACKAGING SUBSTRATE FIRST BOND

(71) Applicants: Michael G. Kelly, Queen Creek, AZ (US); Ronald Patrick Huemoeller, Gilbert, AZ (US); Won Chul Do, Bucheon-si (KR); David Jon Hiner, Chandler, AZ (US)

(72) Inventors: Michael G. Kelly, Queen Creek, AZ (US); Ronald Patrick Huemoeller, Gilbert, AZ (US); Won Chul Do, Bucheon-si (KR); David Jon Hiner, Chandler, AZ (US)

(73) Assignee: Amkor Technology, Inc., Tempe, AZ (US)

( * ) Notice: Subject to any disclaimer, the term of this patent is extended or adjusted under 35 U.S.C. 154(b) by 0 days.

(21) Appl. No.: 13/678,058

(22) Filed: Nov. 15, 2012

(65) Prior Publication Data
US 2014/0134804 A1    May 15, 2014

(51) Int. Cl.
*H01L 21/762* (2006.01)
*H01L 23/14* (2006.01)
(Continued)

(52) U.S. Cl.
CPC ........ *H01L 21/76251* (2013.01); *H01L 21/486* (2013.01); *H01L 21/6838* (2013.01); *H01L 23/147* (2013.01); *H01L 23/49827* (2013.01); *H01L 24/81* (2013.01); *H01L 24/83* (2013.01); *H01L 24/95* (2013.01); *H01L 23/49816* (2013.01); *H01L 23/49833* (2013.01); *H01L 23/544* (2013.01); *H01L 24/13* (2013.01); *H01L 2221/68322* (2013.01); *H01L 2223/54486* (2013.01); *H01L 2224/13147* (2013.01); *H01L 2224/16145* (2013.01); *H01L 2224/16225* (2013.01); *H01L 2224/32145* (2013.01); *H01L 2224/73204* (2013.01); *H01L 2224/73253* (2013.01); *H01L 2224/81001* (2013.01); *H01L 2224/81011* (2013.01); *H01L 2224/81191* (2013.01); *H01L 2224/81203* (2013.01);
(Continued)

(58) Field of Classification Search
CPC ............................................. H01L 2221/68322
USPC ........................................................ 438/109
See application file for complete search history.

(56) References Cited

U.S. PATENT DOCUMENTS

| 6,629,363 | B1 * | 10/2003 | Chan ............................... 29/832 |
| 7,977,802 | B2 | 7/2011 | Pagaila |
| 8,288,201 | B2 | 10/2012 | Pagaila |
| 2007/0287265 | A1 * | 12/2007 | Hatano et al. ................. 438/458 |

(Continued)

OTHER PUBLICATIONS

PCT, Notification of Transmittal of the International Search Report and the Written Opinion of the International Searching Authority, or the Declaration, in International application No. PCT/US13/68521 dated Apr. 7, 2014. (22 pages).

*Primary Examiner* — Angel Roman
(74) *Attorney, Agent, or Firm* — McAndrews, Held & Malloy

(57) ABSTRACT

Methods and systems for a semiconductor device package with a die-to-packing substrate first bond are disclosed and may include bonding a first semiconductor die to a packaging substrate, applying an underfill material between the first semiconductor die and the packaging substrate, and bonding one or more additional die to the first semiconductor die. The additional die may comprise electronic devices. The first semiconductor die may comprise an interposer die or may comprise electronic devices. The first semiconductor die may be bonded to the packaging substrate utilizing a mass reflow process or a thermal compression process. The additional die may be bonded to the first die utilizing a mass reflow process or a thermal compression process. The bonded die may be encapsulated in a mold material, which may comprise a polymer. The one or more additional die may comprise microbumps for coupling to the first semiconductor die.

20 Claims, 18 Drawing Sheets

(51) Int. Cl.
  *H01L 21/48* (2006.01)
  *H01L 21/683* (2006.01)
  *H01L 23/544* (2006.01)
  *H01L 23/00* (2006.01)
  *H01L 23/498* (2006.01)

(52) U.S. Cl.
  CPC .......... *H01L2224/81815* (2013.01); *H01L 2224/83101* (2013.01); *H01L 2224/83192* (2013.01); *H01L 2224/83203* (2013.01); *H01L 2224/83855* (2013.01); *H01L 2224/92125* (2013.01); *H01L 2924/15311* (2013.01); *H01L 2924/1616* (2013.01); *H01L 2924/16152* (2013.01); *H01L 2924/19105* (2013.01)

(56) References Cited

U.S. PATENT DOCUMENTS

| | | | |
|---|---|---|---|
| 2008/0169545 A1* | 7/2008 | Kwon et al. | 257/686 |
| 2010/0276796 A1* | 11/2010 | Andry et al. | 257/692 |
| 2010/0327419 A1* | 12/2010 | Muthukumar et al. | 257/686 |
| 2011/0308739 A1* | 12/2011 | McCutcheon et al. | 156/766 |
| 2012/0074585 A1* | 3/2012 | Koo et al. | 257/774 |
| 2012/0175767 A1 | 7/2012 | Hung | |
| 2012/0238057 A1* | 9/2012 | Hu et al. | 438/107 |
| 2012/0241965 A1* | 9/2012 | Hu et al. | 257/773 |
| 2013/0187258 A1* | 7/2013 | Lu et al. | 257/621 |
| 2013/0217188 A1* | 8/2013 | Wang et al. | 438/118 |
| 2013/0249106 A1* | 9/2013 | Lin et al. | 257/774 |
| 2014/0001652 A1* | 1/2014 | Chen et al. | 257/777 |

* cited by examiner

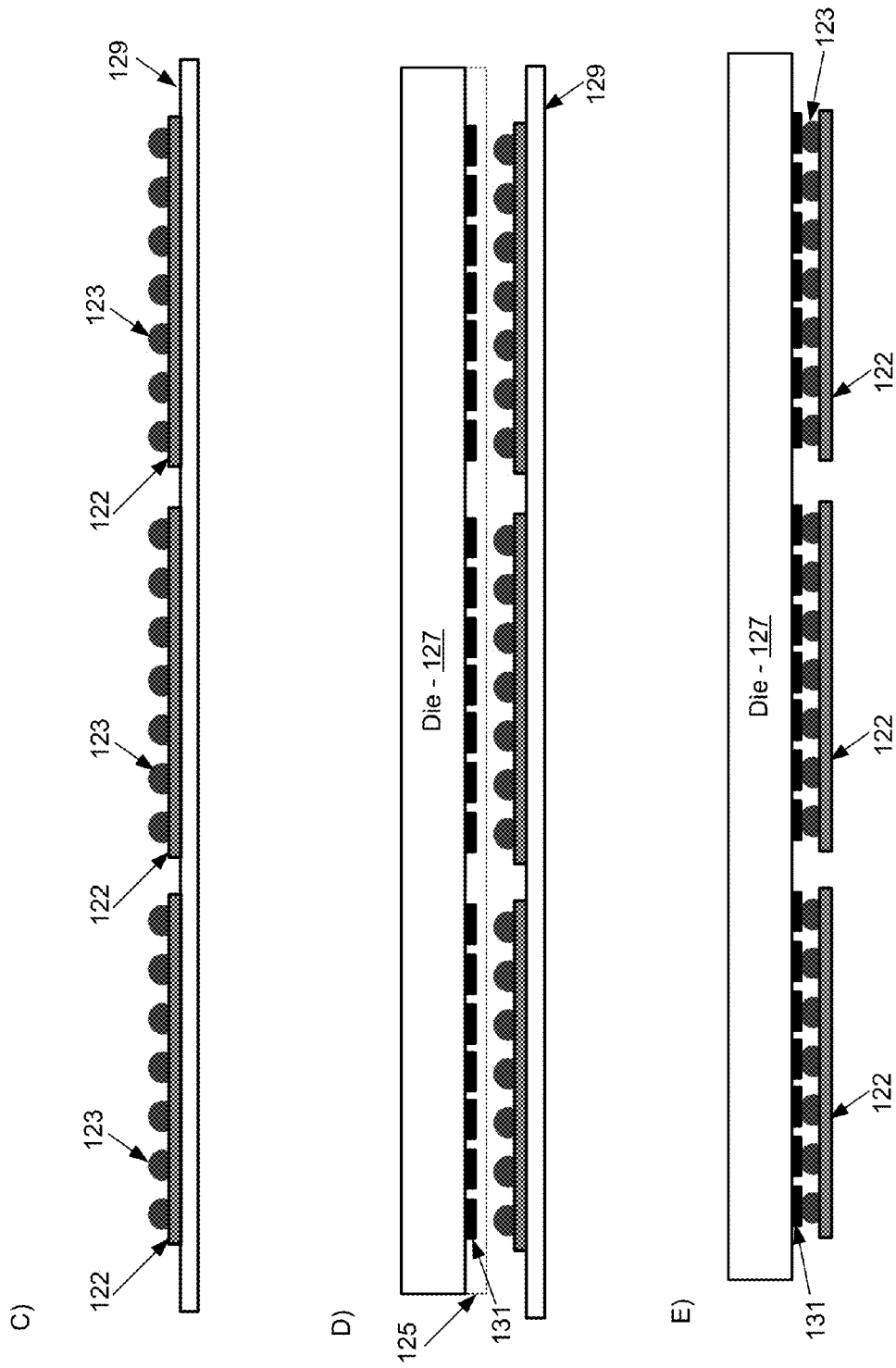

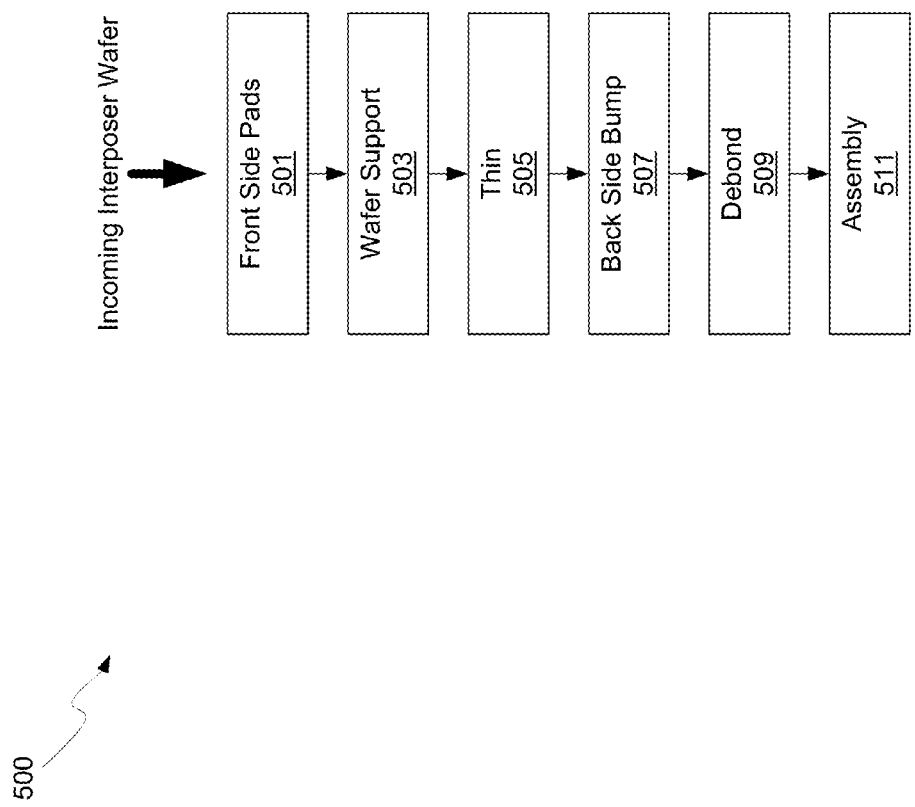

METHOD AND SYSTEM FOR A SEMICONDUCTOR FOR DEVICE PACKAGE WITH A DIE-TO-PACKAGING SUBSTRATE FIRST BOND

CROSS-REFERENCE TO RELATED APPLICATIONS/INCORPORATION BY REFERENCE

This application is related to U.S. application Ser. No. 13/678,046, filed on Nov. 15, 2012, and U.S. application Ser. No. 13/678,012, filed on Nov. 15, 2012. Each of the above cited applications is incorporated herein by reference in its entirety.

FIELD OF THE INVENTION

Certain embodiments of the invention relate to semiconductor chip packaging. More specifically, certain embodiments of the invention relate to a method and system for a semiconductor device package with a die-to-packaging substrate first bond.

BACKGROUND OF THE INVENTION

Semiconductor packaging protects integrated circuits, or chips, from physical damage and external stresses. In addition, it can provide a thermal conductance path to efficiently remove heat generated in the chip, and also provide electrical connections to other components such as printed circuit boards, for example. Materials used for semiconductor packaging typically comprises ceramic or plastic, and form-factors have progressed from ceramic flat packs and dual in-line packages to pin grid arrays and leadless chip carrier packages, among others.

Further limitations and disadvantages of conventional and traditional approaches will become apparent to one of skill in the art, through comparison of such systems with the present invention as set forth in the remainder of the present application with reference to the drawings.

BRIEF DESCRIPTION OF SEVERAL VIEWS OF THE DRAWINGS

FIGS. 1C-1E illustrate steps for bonding multiple die utilizing an adhesive film, in accordance with an example embodiment of the invention.

FIG. 5 is a flow diagram illustrating an interposer fabrication process, in accordance with an example embodiment of the invention.

DETAILED DESCRIPTION OF THE INVENTION

Certain aspects of the invention may be found in a method and system for a semiconductor device package with a die-to-packing substrate first bond. Example aspects of the invention may comprise bonding a first semiconductor die to a packaging substrate, applying an underfill material between the first semiconductor die and the packaging substrate, and bonding one or more additional die to the first semiconductor die. The one or more additional die may comprise electronic devices. The first semiconductor die may comprise an interposer die, or the first semiconductor die may comprise electronic devices. The first semiconductor die may be bonded to the packaging substrate utilizing a mass reflow process or a thermal compression process. The one or more additional die may be bonded to the first die utilizing a mass reflow process or a thermal compression process. The bonded first die and the bonded one or more additional die may be encapsulated in a mold material. The mold material may comprise a polymer. The one or more additional die may comprise micro-bumps for coupling to the first semiconductor die.

Figure 1A:
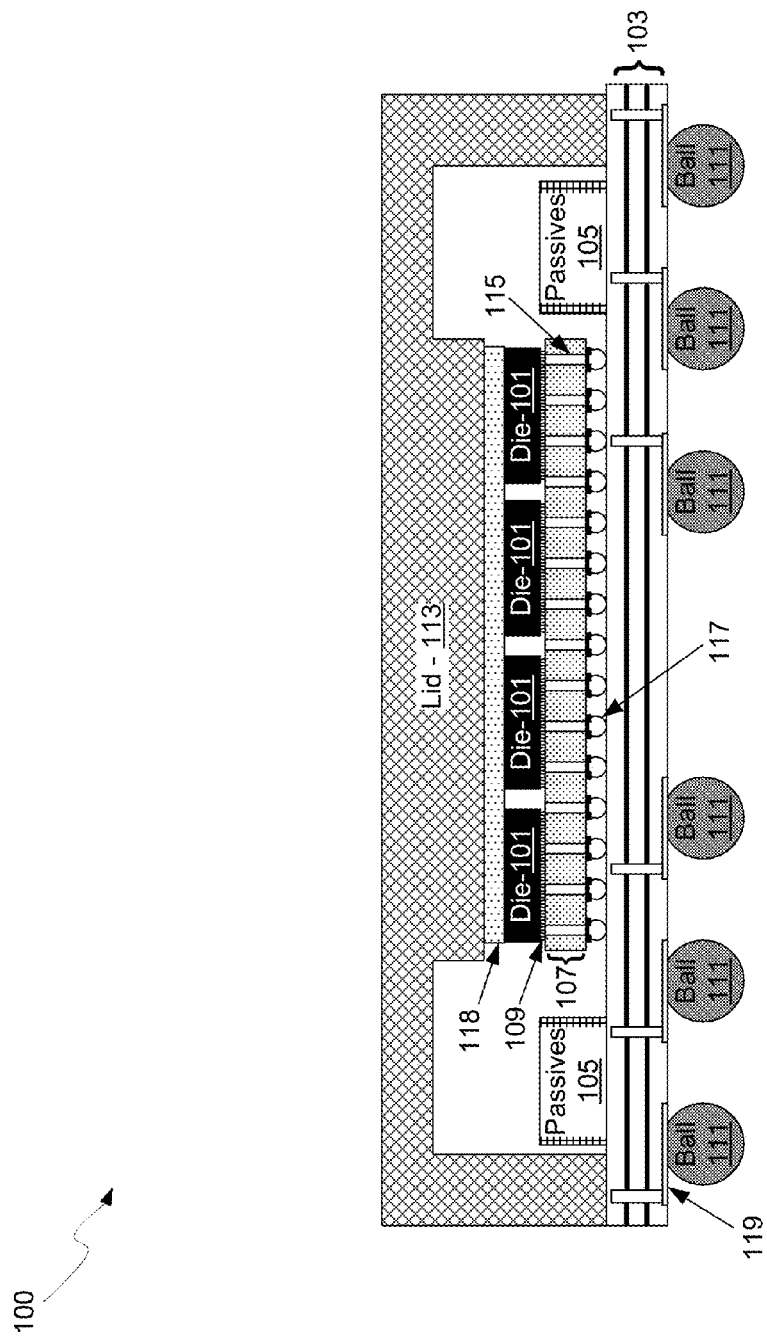
FIG. 1A is a schematic illustrating an integrated circuit package configured with an interposer-to-packaging substrate first bond, in accordance with an example embodiment of the invention.

FIG. 1A is a schematic illustrating an integrated circuit package configured with an interposer-to-packaging substrate first bond, in accordance with an example embodiment of the invention. Referring to FIG. 1A, there is shown a package 100 comprising die 101, a packaging substrate 103, passive devices 105, an interposer 107, solder balls 111, a lid 113, and thermal interface material 118.

The die 101 may comprise integrated circuit die that have been separated from one or more semiconductor wafers. The die 101 may comprise electrical circuitry such as digital signal processors (DSPs), network processors, power management units, audio processors, RF circuitry, wireless baseband system-on-chip (SoC) processors, sensors, and application specific integrated circuits, for example. In addition, the die 101 may comprise micro-bumps 109 for providing electrical contact between the circuitry in the die 101 and contact pads on the surface of the interposer 107.

The interposer 107 may comprise a semiconductor die, such as a silicon die, with through-silicon-vias (TSVs) 115 that provide electrically conductive paths from one surface of the interposer 107 to the opposite surface. The interposer 107 may also comprise backside bumps 117 for making electrical and mechanical contact to the packaging substrate 103. In another example scenario, the interposer 107 may comprise glass or an organic laminate material, either of which may be capable of large panel formats on the order of 500×500 mm, for example.

The packaging substrate 103 may comprise a mechanical support structure for the interposer 107, the die 101, the passive devices 105, and the lid 113. The packaging substrate 103 may comprise solder balls 111 on the bottom surface for providing electrical contact to external devices and circuits, for example. The packaging substrate 103 may also comprise conductive traces in a non-conductive material for providing conductive paths from the solder balls to the die 101 via pads that are configured to receive the backside bumps 117 on the interposer 107. Additionally, the packaging substrate 103 may comprise pads 119 for receiving the solder balls 111. The pads 119 may comprise one or more under-bump metals, for example, for providing a proper electrical and mechanical contact between the packaging substrate 103 and the solder balls 111.

The passive devices 105 may comprise electrical devices such as resistors, capacitors, and inductors, for example, which may provide functionality to devices and circuits in the die 101. The passive devices 105 may comprise devices that are difficult to integrate in the integrated circuits in the die 101, such as high value capacitors or inductors. In another example scenario, the passive devices 105 may comprise one or more crystal oscillators for providing one or more clock signals to the die 101.

The lid 113 may provide a hermetic seal for the devices within the cavity defined by the lid 110 and the packaging substrate 103. A thermal interface may be created for heat transfer out of the die 101 to the lid 113 via the thermal interface material 118, which may also act as an adhesive.

In an example scenario, the package 100 may be fabricated by first bonding the interposer 107 to the packaging substrate 103 utilizing a mass reflow or thermal compression process. The die 101 may subsequently be bonded to the interposer 107 utilizing either mass reflow or thermal compression. A capillary underfill process may follow the bonding process for mechanical and insulating purposes. Electrical tests may be performed following the bonding processes to verify that proper electrical connections were made and no shorts or open circuits exist.

Figure 1B:
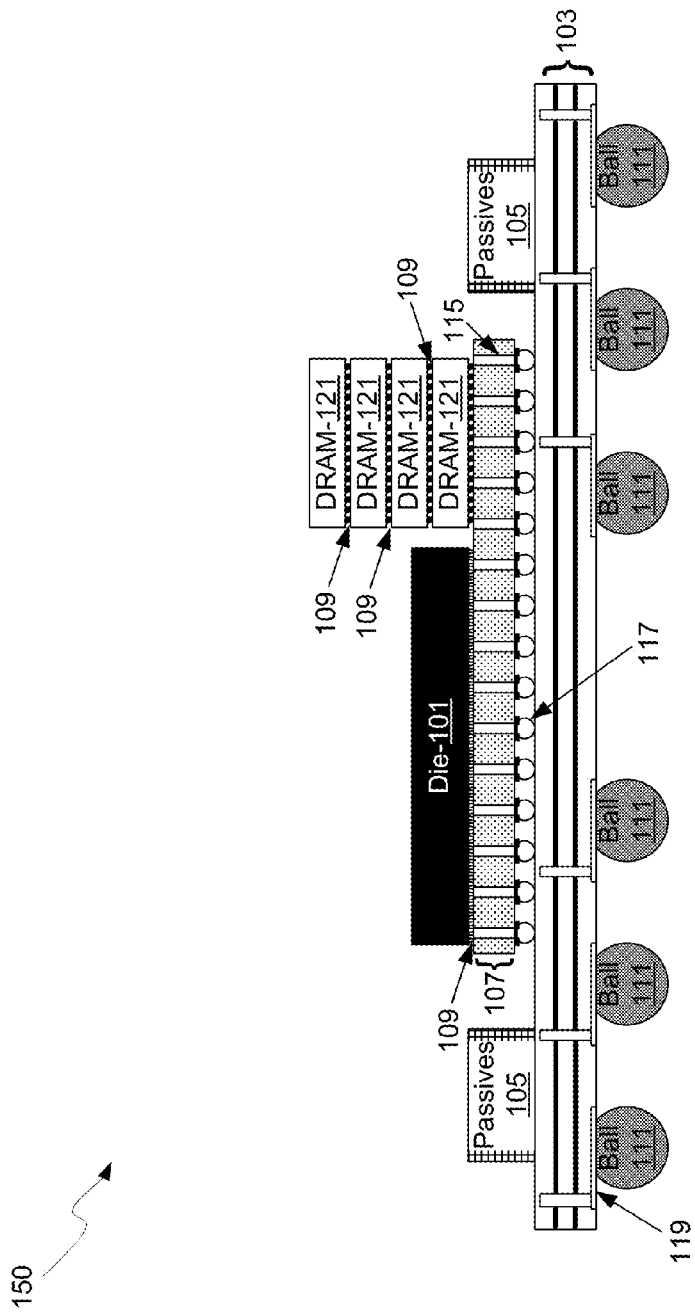
FIG. 1B is a schematic illustrating an integrated circuit package configured with an interposer-to-packaging substrate first bond and stacked die, in accordance with an example embodiment of the invention.

FIG. 1B is a schematic illustrating an integrated circuit package configured with an interposer-to-packaging substrate first bond and stacked die, in accordance with an example embodiment of the invention. Referring to FIG. 1B, there is shown a package 150 comprising the die 101, the packaging substrate 103, the passive devices 105, the interposer 107, and a stack of dynamic random access memory (DRAM) 121. The die 101, the packaging substrate 103, the passive devices 105, and the interposer 107 may be substantially as described with respect to FIG. 1A, for example, but with different electrical connectivity for the different die 101 and the stack of DRAM 121.

The DRAM 121 may comprise a stack of die for providing a high density memory for circuitry in the die 101 or external to the package 100. The DRAM 121 may be stacked front-to-back and therefore comprise TSV's for providing electrical connectivity between the individual die.

In an example scenario, the package 150 may be fabricated by first bonding the interposer 107 to the packaging substrate 103 utilizing a mass reflow or thermal compression process. The die 101 may subsequently be bonded to the interposer 107 utilizing either mass reflow or thermal compression. In addition, the stack of DRAM 121 may then be bonded to the interposer 107. A capillary underfill process may follow the bonding process for mechanical and insulating purposes. Electrical tests may be performed following the bonding processes to verify that proper electrical connections were made and no shorts or open circuits exist.

FIGS. 1C-1E illustrate steps for bonding multiple die utilizing an adhesive film, in accordance with an example embodiment of the invention. Referring to FIG. 1C, there is shown a plurality of die 122 and an adhesive layer 129. Each of the plurality of die 122 may comprise a metal interconnect 123 for subsequent bonding to other die. In another example scenario, the metal interconnects 123 may comprise microbumps or copper pillars, for example.

The adhesive film 129 may comprise an adhesive tape or compliant layer, for example, to which the plurality of die 122 may be bonded, as illustrated in FIG. 1C. The adhesive film 129 may be a temporary adhesive for attaching multiple die to another die. In an example scenario, the plurality of die 122 may be placed temporarily on the adhesive film 129. While FIG. 1C illustrates the plurality of die 122 as consisting of three die, more or less die (including a single die) are also possible and contemplated.

An optional underfill material 125 may also be placed on a die 127 as shown in FIG. 1D, once the plurality of die 122 have been attached to the adhesive film 129. The underfill material 125 may be for subsequent thermal compression bonding processes, for example, and may allow instant underfill through a snap cure during a subsequent thermal compression bonding process. This may improve bonding yields since a single underfill process may be utilized for the plurality of die 122 as compared to a separate place and underfill process for each of the plurality of die 122. The plurality of die 122 may be placed face up so that the metal interconnects 123 may be coupled to a receiving die.

The plurality of die 122 on the adhesive film 129 may then be placed on the die 127 (or other substrate, for example, a packaging substrate), as shown in FIGS. 1D and 1E, for example, where the initial placement of the plurality of die 122 on the adhesive film 129 may enable fine control of the spacing and alignment of the plurality of die 122 with the die 127. In an example scenario, the die 127 may be gang bonded to the individual die 122. The die 127 may comprise metal pads 131 for receiving the metal interconnects 123. Once the plurality of die 122 are placed on the die 127, a thermal compression bond process may be performed for proper electrical and mechanical bonds between the metal interconnects 123 and the metal pads 131. Once bonded, the adhesive film 129 may be removed resulting in the structure shown in FIG. 1E.

Figure 2:
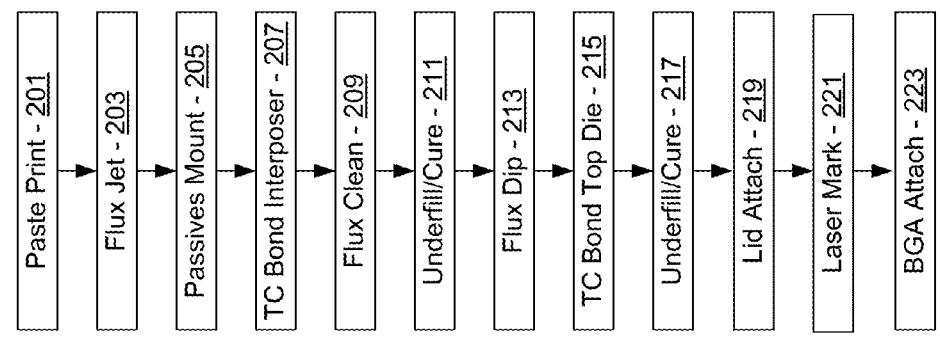
FIG. 2 is a schematic illustrating a die to packaging substrate process flow, in accordance with an example embodiment of the invention.

FIG. 2 is a schematic illustrating a die to packaging substrate process flow, in accordance with an example embodiment of the invention. Referring to FIG. 2, there is shown die to packaging process 200 that comprises a paste print step 201, a flux jet step 203, a passives mount step 205, and thermal compression bond interposer step 207. The packaging process 200 may also comprise a flux clean step 209, an underfill and cure step 211, a flux dip step 213, and a thermal compression top die bond step 215. These steps may be followed by an underfill and cure step 217, a lid attach step 219, a laser mark step 221, and a ball grid array (BGA) attach step 223.

The paste print step 201 may comprise the application of non-conductive paste to assist in the subsequent thermal compression bonding of die to the packaging substrate. The die to be bonded may comprise an interposer die or a functional die, which may comprise digital signal processors (DSPs), network processors, power management units, audio processors, RF circuitry, wireless baseband system-on-chip (SoC) processors, sensors, and application specific integrated circuits, for example.

The flux jet step 203 may comprise the preparation of the conductive surfaces on the packaging substrate for subsequent conductive bonding. The flux process may comprise a surface cleaning step and may remove excessive oxide layers on the surfaces to be bonded. For example, the pads on the packaging substrate may be fluxed for subsequent bonding with backside bumps on the interposer die or for microbumps on a functional die. Additionally, bond pads on the packaging substrate may be prepared for the subsequent mounting of passive devices.

Figure 3:
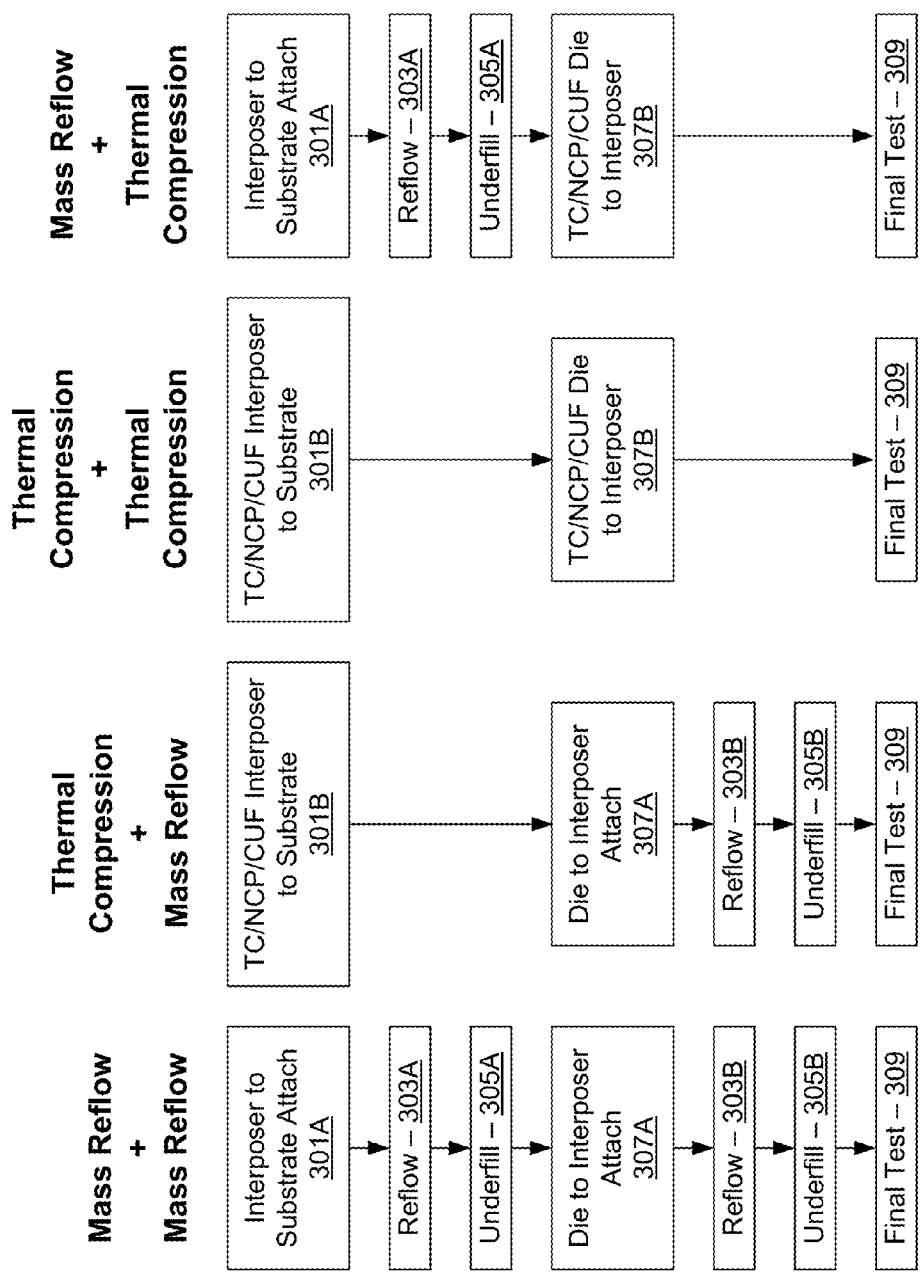
FIG. 3 is a schematic illustrating bonding options for die in a package, in accordance with an example embodiment of the invention.
Figure 7:
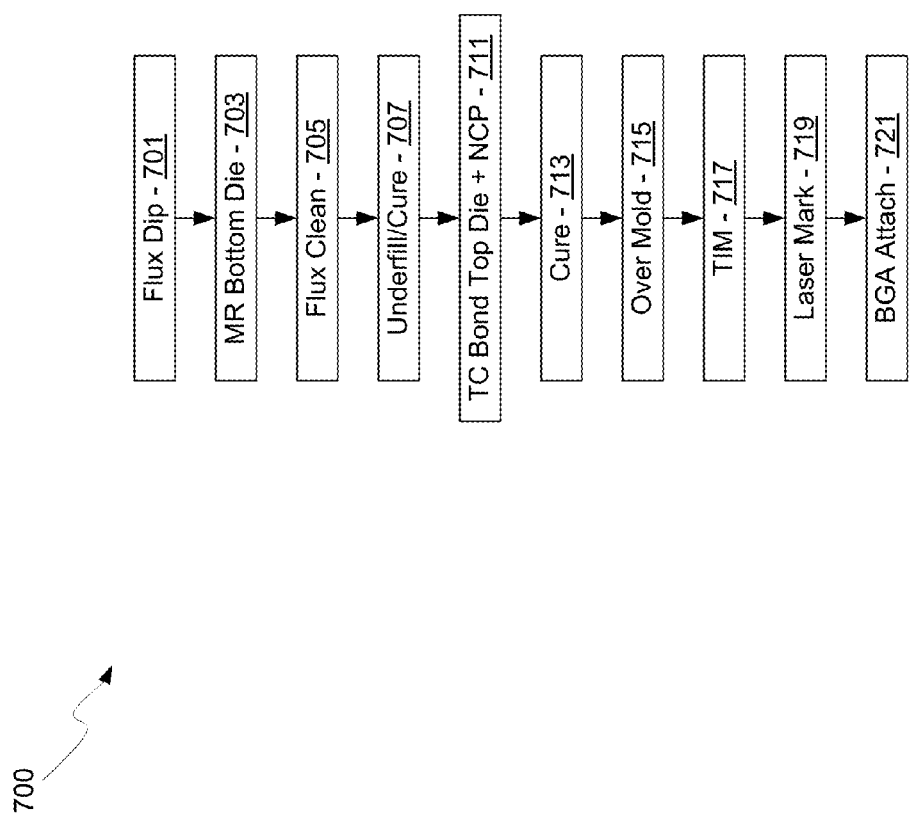
FIG. 7 is a flow diagram illustrating a stacked die to packaging substrate fabrication process, in accordance with an example embodiment of the invention.

In the passives mount step 205, passive devices, such as the passive devices 105 described with respect to FIGS. 1A and 1B, may be mounted to the packaging substrate. In the thermal compression bond Interposer step 207, an interposer die may be bonded to the packaging substrate utilizing a thermal compression bonding process. The previously applied non-conductive paste may be physically displaced by the compression of conductive surfaces. While a thermal compression bonding process is shown in FIG. 2, a mass reflow process may also be used for bonding the interposer or functional die to the packaging substrate. Examples of this process are shown in FIGS. 3 and 7.

In the flux clean step 209, residual flux may be removed in a solvent and/or deionized (DI) water rinse, for example, followed by a drying process at an elevated temperature. This may prepare the bonded structure for a capillary underflow process in the underfill/cure step 211. In this process, an underflow material may be injected at the edges of the bonded die and capillary action at an elevated temperature may distribute the material uniformly under the bonded die, providing a protective dielectric layer around the electrical bonds. Once the capillary action has distributed the underfill material, it may be cured at an elevated temperature for an extended time.

Following the capillary underfill and cure process, the flux dip step 213 may be performed, which may flux the bond regions on the bonded interposer or functional die for subsequent bonding to microbumps on other die. The flux material may provide a cleaning mechanism for the bonding surfaces and may remove excess oxide layers from the metal.

A top die may then be bonded to the structure in a thermal compression top die step 215. The top die may be bonded to the previously bonded interposer die or a previously bonded functional die. The top die may be pressed against the interposer die/packaging substrate at an elevated temperature to provide an electrical and mechanical support formed by the bonded contacts. As with the thermal compression bond interposer step 207, the thermal compression bond top die step 215 may instead comprise a mass reflow bonding process, as illustrated in FIG. 3, for example.

Another underfill and cure process may be performed, but for the top die, in the underfill/cure step 217, which may comprise the injection of an underfill material that may redistribute under the top die via capillary action at an elevated temperature. Similarly, the underfill material may then be cured at an elevated temperature for an extended time, up to a few hours, for example.

The process may continue with the lid attach step 219, which may place a protective and hermetic seal, if desired, over the bonded die, interposer, and packaging substrate, similar to the lid 113 shown in FIG. 1A for example. This may be followed by a laser mark step 221 where identifying marks may be made in the lid and/or packaging substrate. Finally, a ball grid array (BGA) attach step 223 may be performed to mount solder balls, e.g. solder balls 111, to the packaging substrate for subsequent bonding to a circuit board or other support structure. The BGA may be subjected to a reflow process to ensure good electrical and mechanical contact to the pads on the packaging substrate.

FIG. 3 is a schematic illustrating bonding options for die in a package, in accordance with an embodiment of the invention. Referring to FIG. 3, there are shown four process variations comprising mass reflow and thermal compression bonding steps. Each process illustrates a first die bonding process, which may comprise an interposer die to a packaging substrate, and a second bond comprising a die to the previously bonded interposer die.

The first process comprises a mass reflow/mass reflow process, with the first step being an interposer die to substrate attach step 301A, followed by a reflow step 303A, and underfill step 305A, a die to interposer attach step 307A, a second reflow step 303B, a second underfill step 305B, and a final test step 309.

In this example scenario, the interposer die to substrate attach step 301A and the die to interposer attach step 307A may comprise mass reflow bonding processes (e.g., at steps 303A and 303B, respectively).

The second process flow comprises a thermal compression first bond and a mass reflow second bond. The process thus comprises a thermal compression/non-conductive paste/capillary underfill interposer die to substrate bonding step 301B, a die to interposer attach step 307A, followed by the reflow step 303B, the underfill step 305B, and the final test step 309.

The third process flow comprises two thermal compression bonding processes, so that the process comprises the thermal compression/non-conductive paste/capillary underfill interposer die to substrate bonding step 301B, a thermal compression/non-conductive paste/capillary underfill die to interposer bonding step 307B, and the final test step 309.

Finally, the fourth process flow comprises a mass reflow first bond and a thermal compression second bond, so that the process comprises the interposer die to substrate attach step 301A, the reflow step 303A, the underfill step 305A, the thermal compression/non-conductive paste/capillary underfill die to interposer bonding step 307B, and the final test step 309.

The process flows shown in FIG. 3 illustrate that any combination of mass reflow and thermal compression may be utilized to bond the various die in the package. Thermal compression bonding techniques may be advantageous at 40 micron pitch or less and white bumps, i.e. high-k dielectric layer delamination, may be eliminated with thermal compression bonding. In addition, flatness may be improved with thermal compression bonding, resulting in fewer open circuit connections due to excessive gaps.

Figures 4A, 4B, 4C:
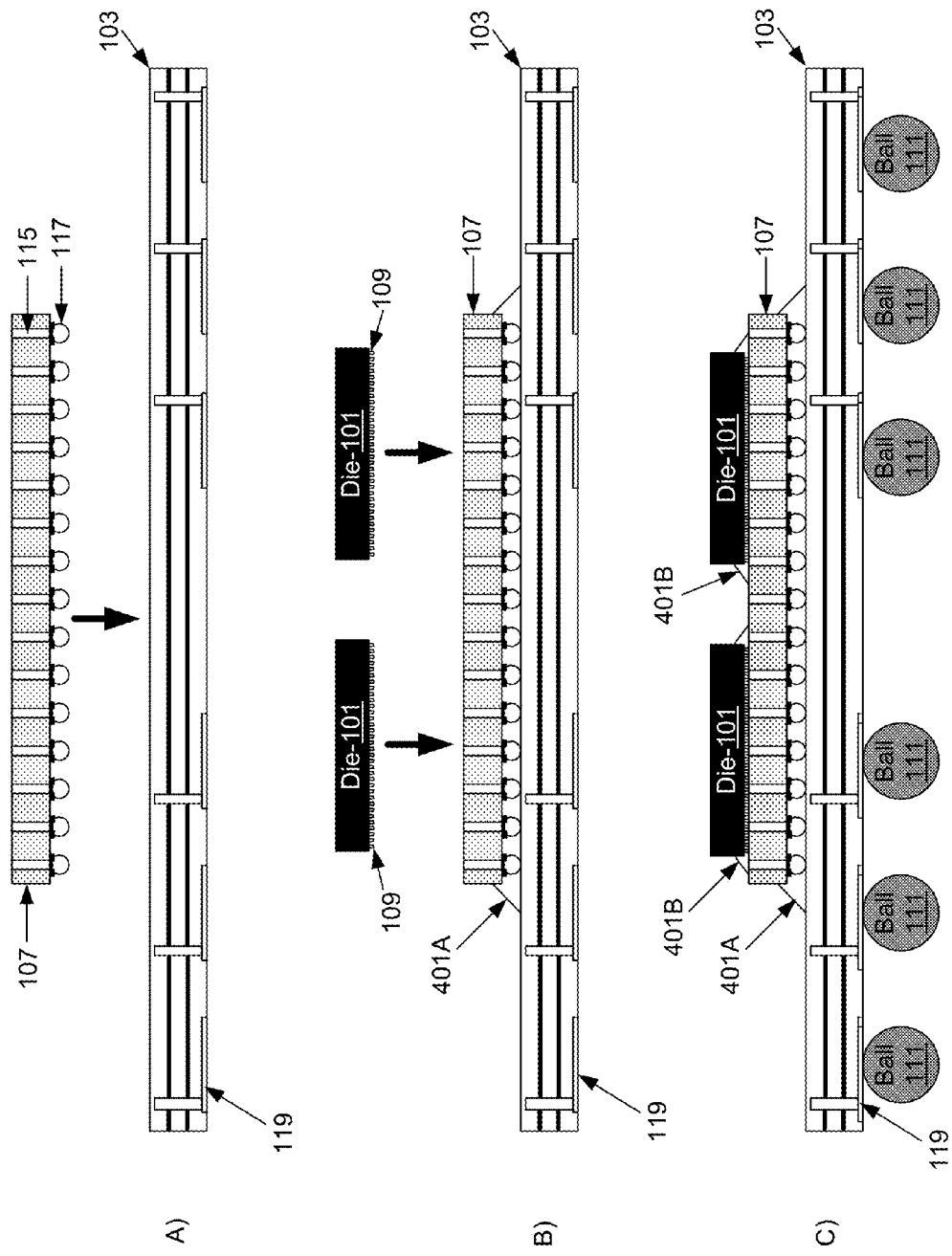
FIGS. 4A-4C illustrate a process for an interposer-to-packaging substrate first bond, in accordance with an example embodiment of the invention.

FIGS. 4A-4C illustrate a process for an interposer-to-packaging substrate first bond, in accordance with an example embodiment of the invention. Referring to FIG. 4A, there is shown the packaging substrate 103 and the interposer 107. The packaging substrate 103 and the interposer 107 may be as described previously, for example, where the packaging substrate 103 may comprise the pads 119 and the interposer 107 may comprise the TSVs 115 and the backside bumps 117.

The interposer die 107 may be bonded to the packaging substrate 103 utilizing a mass reflow process or a thermal compression with non-conductive paste process. The mass reflow process may comprise a flux dip to prepare the metal surfaces for proper bonding. The thermal compression bonding process may comprise the selective application of non-conductive paste or film to assist in the bonding process. In addition, a capillary underfill process may fill the void between the backside bumps 117 in the region between the interposer 107 and the packaging substrate 103, as illustrated by the underfill 401A for example.

In FIG. 4B, the die 101 may be bonded to the interposer die 107 utilizing a mass reflow process or a thermal compression with non-conductive paste process. As with the interposer die 107, a capillary underfill process may fill the void between the microbumps 109 in the region between the die 101 and the interposer die 107, as illustrated by the underfill 401B shown in FIG. 4C for example.

While the coupling of two die 101 to the interposer die 107 is illustrated in FIGS. 4A-4C, the invention is not necessarily so limited. Accordingly, any number of die may be bonded to the interposer 107 determined by available space and power and thermal requirements, for example. Furthermore, die may be stacked on the interposer die 107, as illustrated in FIG. 1B for example.

Finally, the solder balls 111 may be placed on the pads 119 on the packaging substrate 103. A flux process may be utilized to prepare the solder balls 111 and the pads 119. The solder balls 111 may be subjected to a reflow process following placement to make low resistance and mechanically sound contacts to the pads 119.

FIG. 5 is a flow diagram illustrating an interposer fabrication process, in accordance with an example embodiment of the invention. Referring to FIG. 5, an incoming interposer wafer may proceed to the front side pads step 501 where contact pads may be deposited on the front side of the interposer wafer. In an example scenario, the front side pads may comprise nickel/palladium/gold.

The interposer wafer may then proceed to the wafer support step 503, where the wafer may be bonded to a support substrate with an adhesive layer, for example. In an example scenario, the support structure may comprise a rigid substrate, such as a silicon substrate, for example, with an adhesive layer for affixing the interposer wafer. The front surface with contact pads may be affixed to the wafer support to allow processing of the back surface. This support may allow subsequent processing steps, such as thinning of the interposer, without causing catastrophic physical damage.

In the thin step 505, the interposer wafer may be thinned down to a thickness that exposes the TSVs in the substrate. The thinning may comprise a chemical-mechanical polish (CMP) process for removing material at the back surface of the interposer.

The thinning step 505 may be followed by the back side bump step 507, where metal bumps may be attached at the exposed TSVs to enable electrical contact to the back surface. The back side bumps may be utilized to bond the interposer to a packaging substrate, for example. The back side bumps may be subjected to a reflow process to ensure proper electrical and mechanical bonds to the interposer.

After the back bumps have been applied, the interposer may be removed from the wafer support in the debond step 509. This may comprise a thermal ramp for removing the adhesive layer and/or may comprise a solvent step for removing the adhesive. Finally, the interposer may proceed to the assembly step 511, where the interposer may be singulated and integrated into a package as shown in FIGS. 1A-4C, for example.

Figures 6A, 6B:
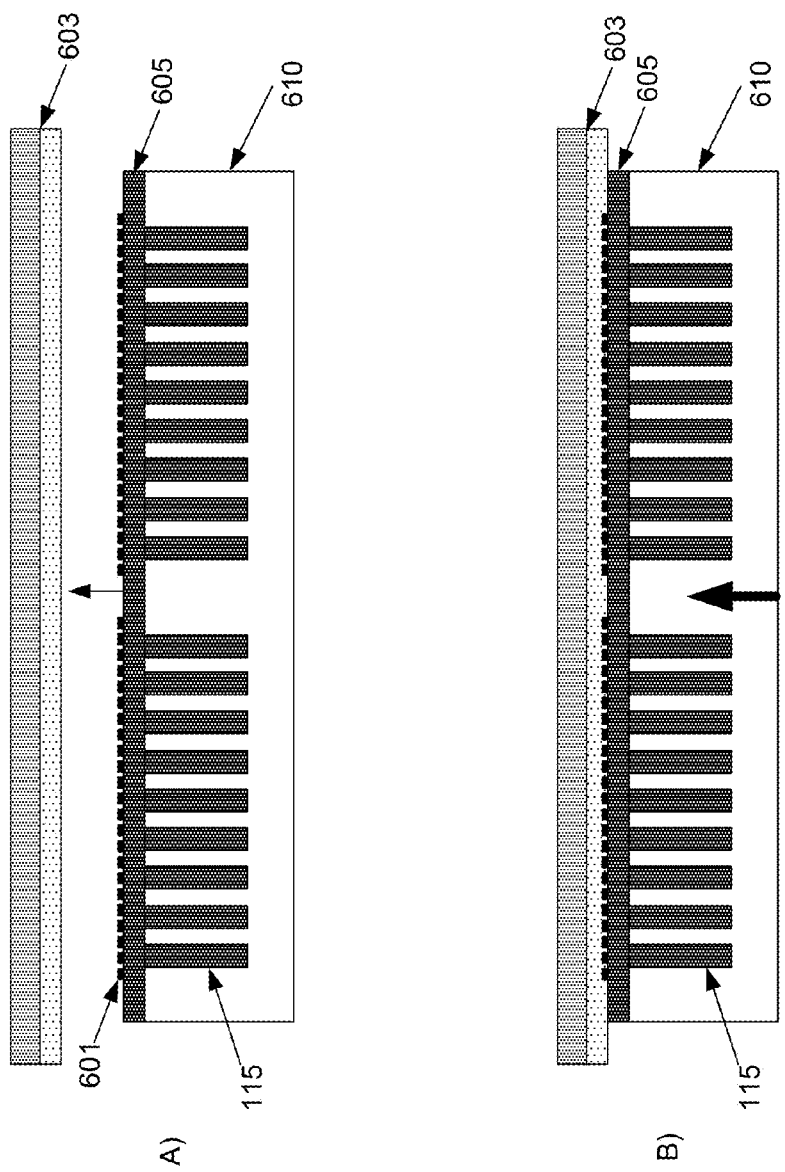
FIGS. 6A-6B illustrate initial steps in an interposer fabrication process, in accordance with an example embodiment of the invention.

FIGS. 6A and 6B illustrate initial steps in an interposer fabrication process, in accordance with an example embodiment of the invention. Referring to FIG. 6A, there is shown an interposer 610 (e.g., an interposer wafer) and a support structure 603. The support structure 603 may comprise a multi-layer structure. In an example scenario, the support structure 603 may comprise a rigid substrate, such as a silicon substrate, for example, with an adhesive layer for affixing the interposer 610 to the support structure 603.

The interposer 610 may comprise a thick substrate prior to thinning, with front side pads 601 that may be utilized as contact pads for semiconductor die that will be coupled to the interposer 610 following processing. The interposer 610 at this stage may be thicker than the thickness of the interposer 107 as integrated in FIGS. 1A-4C for ease of handling and processing, such as the deposition of the front side pads 601. The interposer 610 may comprise TSVs 115 that extend partially through the thick substrate, where the TSVs 115 will be exposed after subsequent thinning of the interposer wafer 610. The interposer 610 may also comprise a metal interconnect layer 605 for coupling the TSVs 115 to appropriate front side pads 601.

FIG. 6B illustrates the support structure 603 affixed to the interposer wafer 610 and the subsequent direction of thinning. The interposer 610 may be thinned utilizing a CMP process, for example, and may be thinned to expose the TSVs 115.

Figures 6C, 6D:
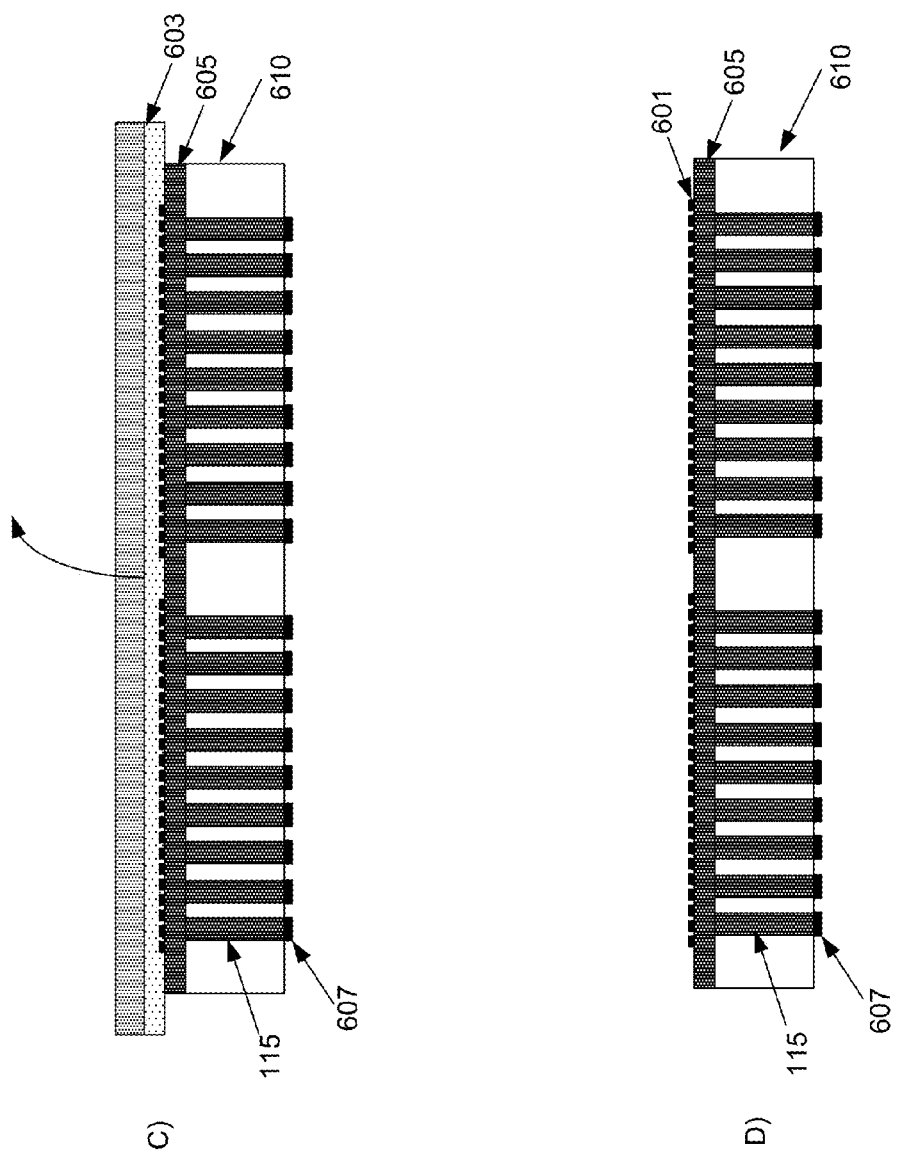
FIGS. 6C-6D illustrate final steps in an interposer fabrication process, in accordance with an example embodiment of the invention.

FIGS. 6C-6D illustrate the final steps in an interposer fabrication process, in accordance with an example embodiment of the invention. Referring to FIG. 6C, there is shown the thinned interposer 610 with the affixed support structure 603. With the TSVs 115 exposed, metal bumps may be attached at the exposed TSV 115 surfaces, resulting in the back side bumps 607, which may be utilized to couple the interposer 610 to a packaging substrate.

After the back side bumps 607 are attached, the support structure 603 may be removed through a heating process, or a solvent process, for example. The resulting structure may comprise an interposer 610 that may subsequently be diced into individual interposers comprising die, such as the interposer 107.

FIG. 7 is a flow diagram illustrating a stacked die to packaging substrate fabrication process, in accordance with an example embodiment of the invention. Referring to FIG. 7, in step flux dip step 701, a packaging substrate may be placed in a flux dip to prepare metal contact surfaces for bonding with metal bumps, such as C4 micro bumps, on a semiconductor die (e.g., an electronics, or functional die, an interposer die, etc.).

In mass reflow bottom die step 703, a first die may be bonded to the packaging substrate utilizing a mass reflow process. While a mass reflow process is shown for attaching the bottom die, the invention is not necessarily so limited. Accordingly, other bonding techniques may be utilized, such as a thermal compression process.

In flux clean step 705, a cleaning process may be performed on the bonded die and packaging substrate to remove any remaining flux, followed by an underfill/cure step 707, where an underfill material may be placed in the space between the bonded die and the packaging substrate. The underfill material may fill the volume under a capillary action, for example. Once the material is injected into the volume, it may be cured at an elevated temperature for hardening.

Once the underfill material is cured, one or more top die may be bonded to the bottom die in the thermal compression top die and non-conductive paste step 711. In this step, a non-conductive paste may be placed on the top surface of the bottom die for subsequent bonding of one or more top die. An example structure may comprise a logic die as the bottom die and one or more memory die as the top die.

In the cure step 713, the non-conductive paste may be cured at an elevated temperature, ensuring a sound mechanical bonding of the top die to the bottom die. This may be followed by the over mold step 715, where a mold material may be placed over the bonded structure to result in a molded package. The mold material may provide encapsulation of the die and substrate package, for example, and may protect the circuitry from external stressors.

In the thermal interface material step 717, a material with good thermal conductivity may be placed on the exposed top surface of the top die. This may enable heat sinking for the bonded die with a thermally conductive layer conducting heat away from the bonded die to a subsequently attached heat sink. In instances where the mold material remains on the top surface of the top die after the over mold step 715, the mold material may be removed in a grind step.

This may be followed by a laser mark step 719 where identifying marks may be placed on the molded package, followed by ball grid array (BGA) attach step 721, where conductive balls may be attached to the bottom surface of the packaging substrate. The BGA may subsequently be utilized to attach the entire package to a circuit board, for example.

Figures 8A, 8B:
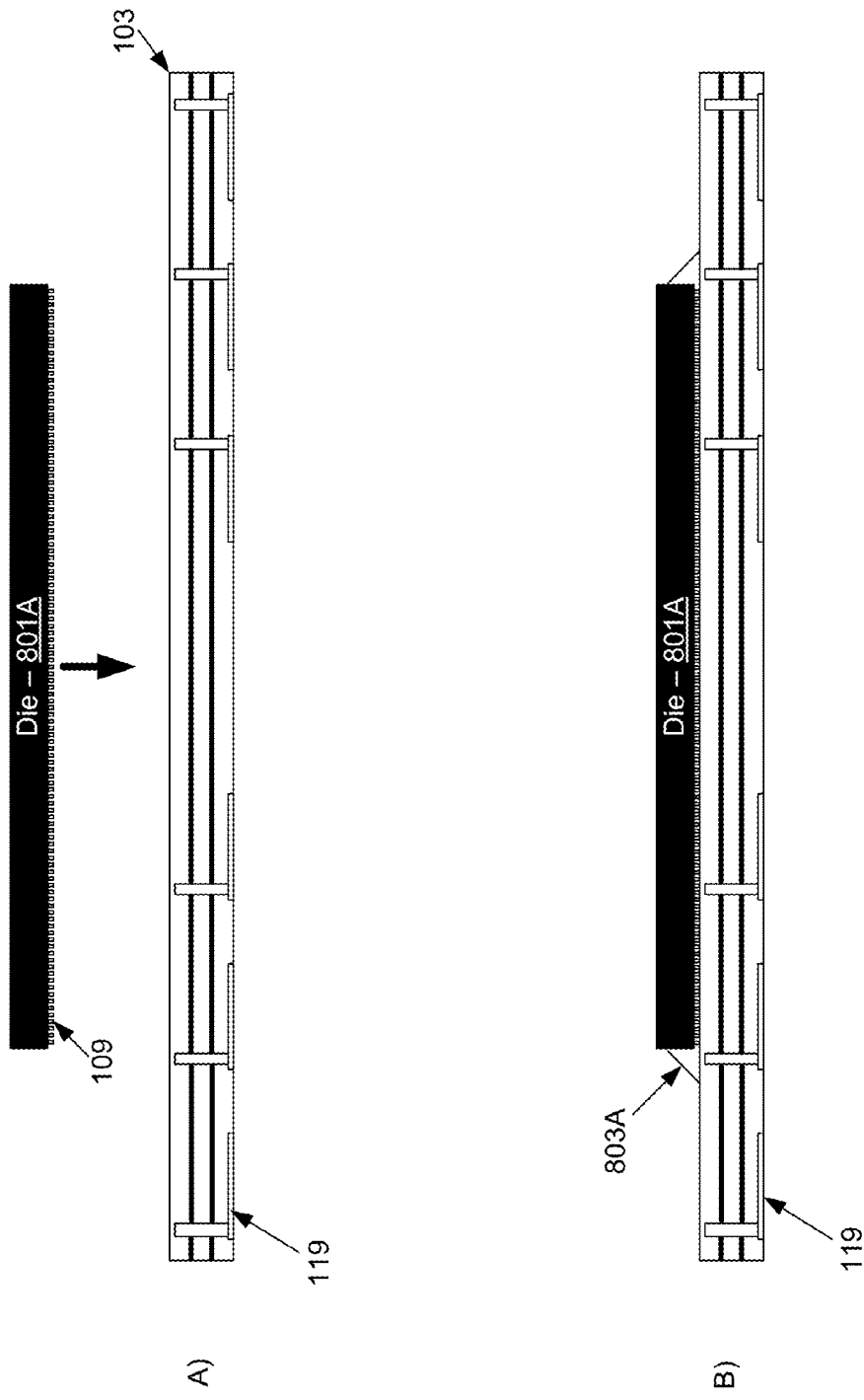
FIGS. 8A-8B illustrate initial steps in a functional die to package substrate assembly process, in accordance with an example embodiment of the invention.

FIGS. 8A and 8B illustrate initial steps in a functional die to package substrate assembly process, in accordance with an example embodiment of the invention. Referring to FIG. 8A, there is shown a die 801A and the packaging substrate 103. The packaging substrate 103 may be as described previously, for example, and may comprise back side pads 119 for subsequent bonding of solder balls.

The die 801A may comprise electrical circuitry such as digital signal processors (DSPs), network processors, power management units, audio processors, RF circuitry, wireless baseband system-on-chip (SoC) processors, sensors, and application specific integrated circuits, for example. Furthermore, the die 801A may comprise the micro-bumps 109 for making electrical contact to the packaging substrate 103. The die 801A may be bonded to the packaging substrate utilizing a mass reflow process or a thermal compression and non-conductive paste bonding process.

Following the bonding process, a capillary underfill process may be performed to fill the volume between the die 801A and the packaging substrate 103 with a subsequent curing process. When deposited or placed, the underfill material 803A may comprise a film, paste, b-stage film, or a liquid, for example. The resulting structure is illustrated in FIG. 8B.

Figures 8C, 8D:
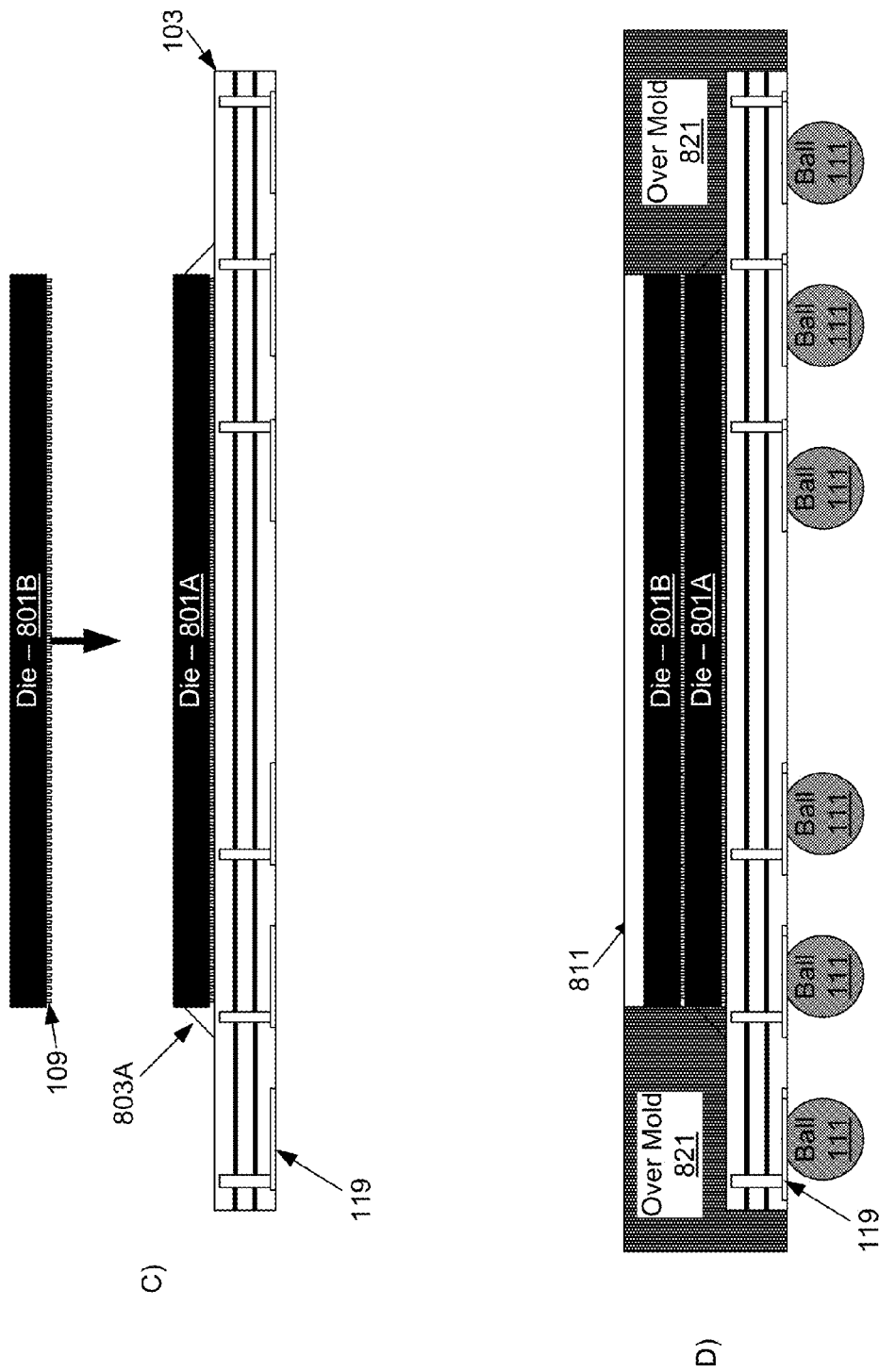
FIGS. 8C-8D illustrate final steps in a functional die to package substrate assembly process, in accordance with an example embodiment of the invention.

FIGS. 8C and 8D illustrate final steps in a functional die to package substrate assembly process, in accordance with an example embodiment of the invention. Referring to FIG. 8C, the die 801B may be bonded to the die 801A previously bonded to the packaging substrate 103. The die 801B may be coupled to the die 801A via a thermal compression and non-conductive paste process. Micro-bumps 109 on the die 801B may be coupled to pads on the die 801A. In another example scenario, the die 801B may be coupled to the die 801A utilizing a mass reflow process.

An over mold process may be utilized to encapsulate the bonded structure, resulting in the over mold 821. The over mold 821 may comprise a polymer that is placed on and around the die 801A and 801B and the packaging substrate 103 via a compression molding process. In an example scenario, the over mold may be placed around the die 801A and 801B, but not on top so that the thermal interface material 811 may be deposited on top of the die 801B. In another example scenario, the over mold process may result in over mold remaining on the top surface of the die 801B but then removed, such as through a grinding or CMP process.

Figure 8E:
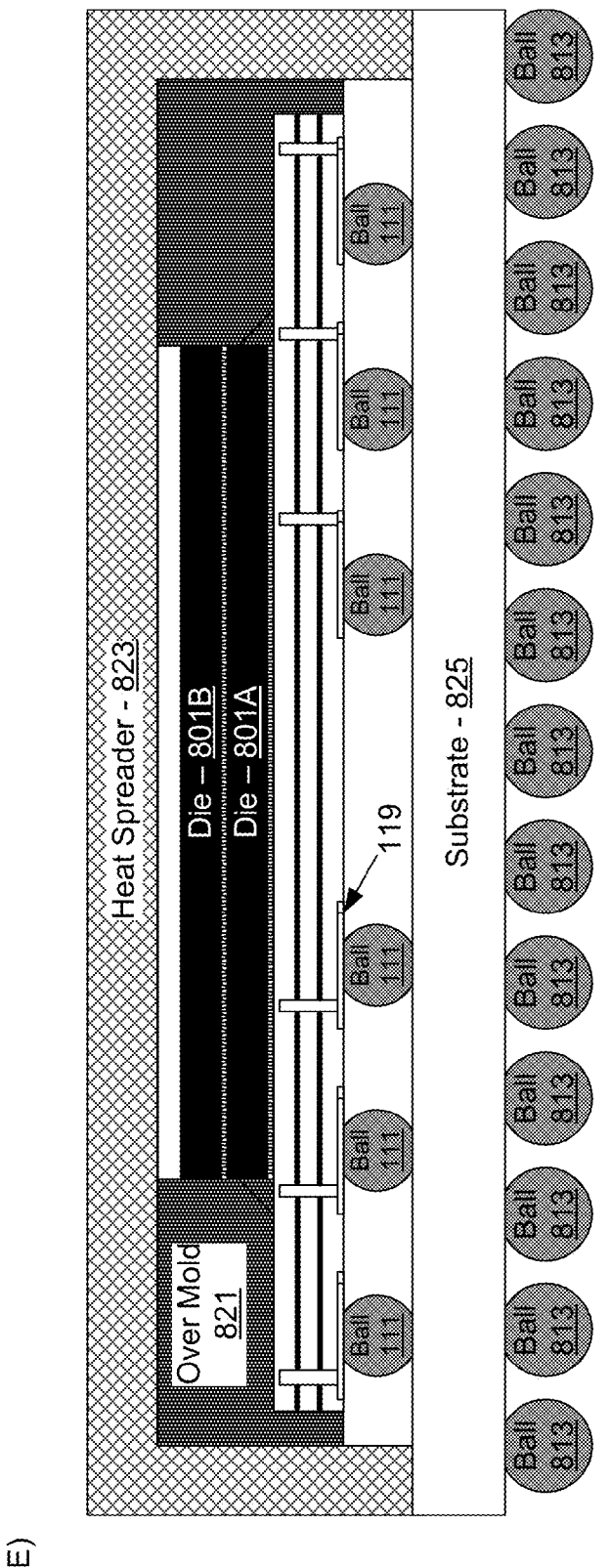
FIG. 8E illustrates the resulting assembly in the die to package substrate process, in accordance with an example embodiment of the invention.

While the underfill material 803A is shown in FIGS. 8C to 8E, the over mold material itself may be utilized as underfill material for each coupling interface, such as between the interposer 103 and the die 801A and between the die 801A and 801B. In another example embodiment, underfill material may be inserted as a liquid or paste, placed as a film, or a b-staged film and may be placed sequentially as each die to substrate or die to die bond is made, or may be made all at one time after all the electrical bonds are made.

The thermal interface material 811 may be utilized to provide a thermal conductive path for heat out of the die 801A and 801B. A heat spreader 823 may be placed above the thermal interface material 811 to enable the heat transfer away from the circuitry in the die 801A and 801B, as illustrated in FIG. 8E.

Furthermore, the solder balls 111 may be bonded to the back side pads 119 on the packaging substrate 103. The solder balls 111 may be operable to provide electrical interconnects to external devices and circuitry, such as to a printed circuit board, for example. It is noted that while solder balls are shown in FIG. 8D, any metal interconnect may be utilized such as microbumps or copper pillars, for example.

FIG. 8E illustrates the resulting assembly in the die to package substrate process, in accordance with an example embodiment of the invention. As shown in FIG. 8E, a substrate 825 may be bonded to the interposer 103 utilizing the solder balls 813 and the heat spreader 823 may be placed over the die 801B in contact with the thermal interface material 811 and the over mold 821. In addition, a thermal interface material may be placed at the contact surface between the heat spreader 823 and the substrate 825.

Figure 9:
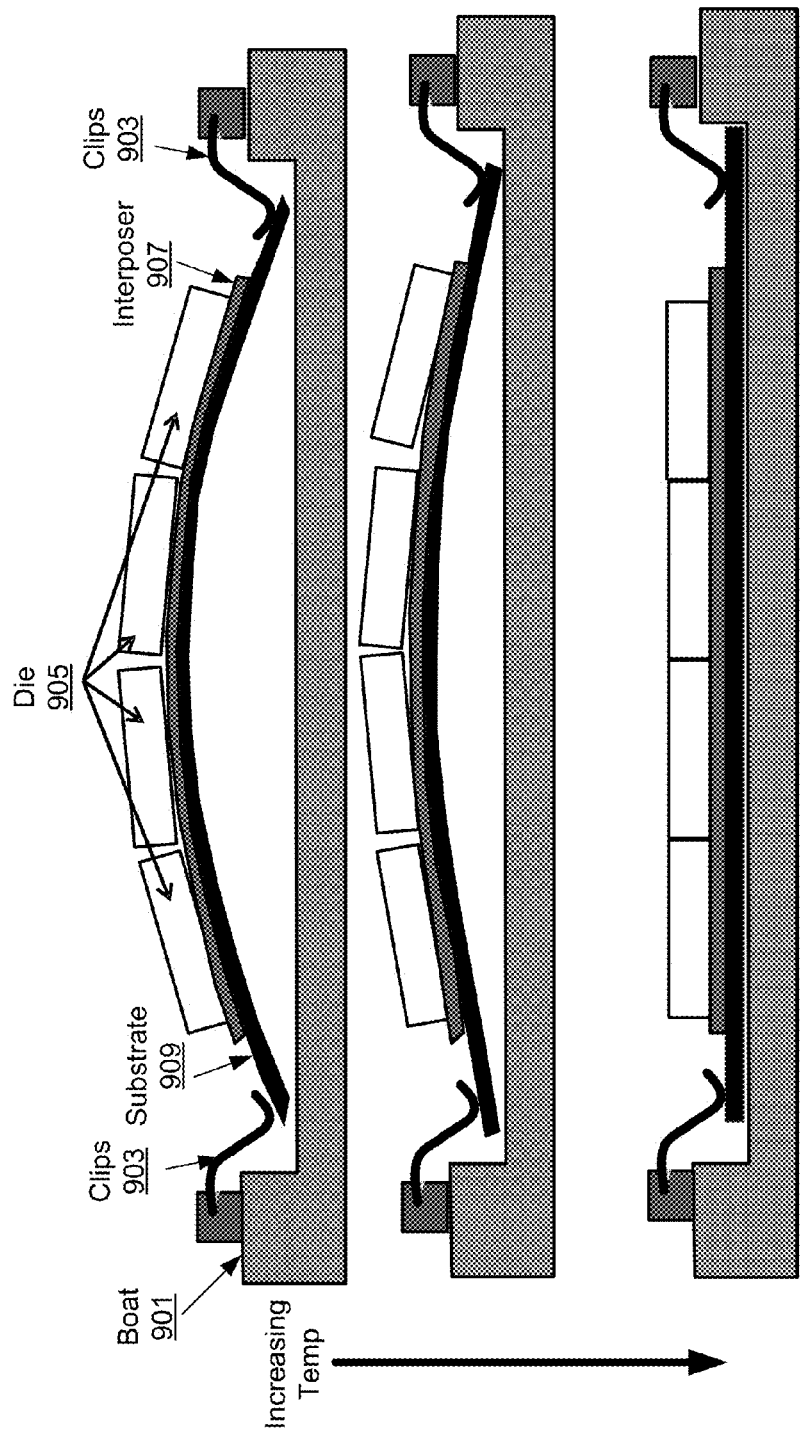
FIG. 9 is a diagram illustrating a mechanical planarizing apparatus, in accordance with an example embodiment of the invention.

FIG. 9 is a diagram illustrating a mechanical planarizing apparatus, in accordance with an example embodiment of the invention. Referring to FIG. 9, there is shown a boat 901, clips 903, a plurality of die 905, an interposer 907, and a substrate 909. The boat 901 may comprise a rigid support structure in which a die/interposer assembly may be placed and held in place by the clips 903. The boat 901 may be capable of withstanding high temperatures, above 200 C, for example.

The interposer 907 may be bonded to the substrate 909 utilizing a thermal compression technique, for example. Similarly, the plurality of die 905 may be bonded to the interposer 907 via a thermal compression bonding, technique, for example, prior to being placed in the boat 901. As the temperature of the boat 901, the plurality of die 905 and the interposer 907 increases, the curvature of an assembly comprising the plurality of die 905 and interposer 907 may flatten with the clips 903 providing a downward force at the outer edges of the assembly. As the curvature approaches zero, the increased length in the lateral direction may be accommodated by sliding under the clips 901. In addition, the boat 901 may provide mechanical support in conjunction with the downward force of the clips 903, thereby planarizing the assembly.

The boat 901 and clips 903 may permit the partially assembled package to heat up in normal fashion, but when that system has become flat, it resists the normal progression of the warpage, holding the partially assembled package to flatten during heating and then maintain that flatness of the silicon interposer as temperatures climb higher.

Figure 10:
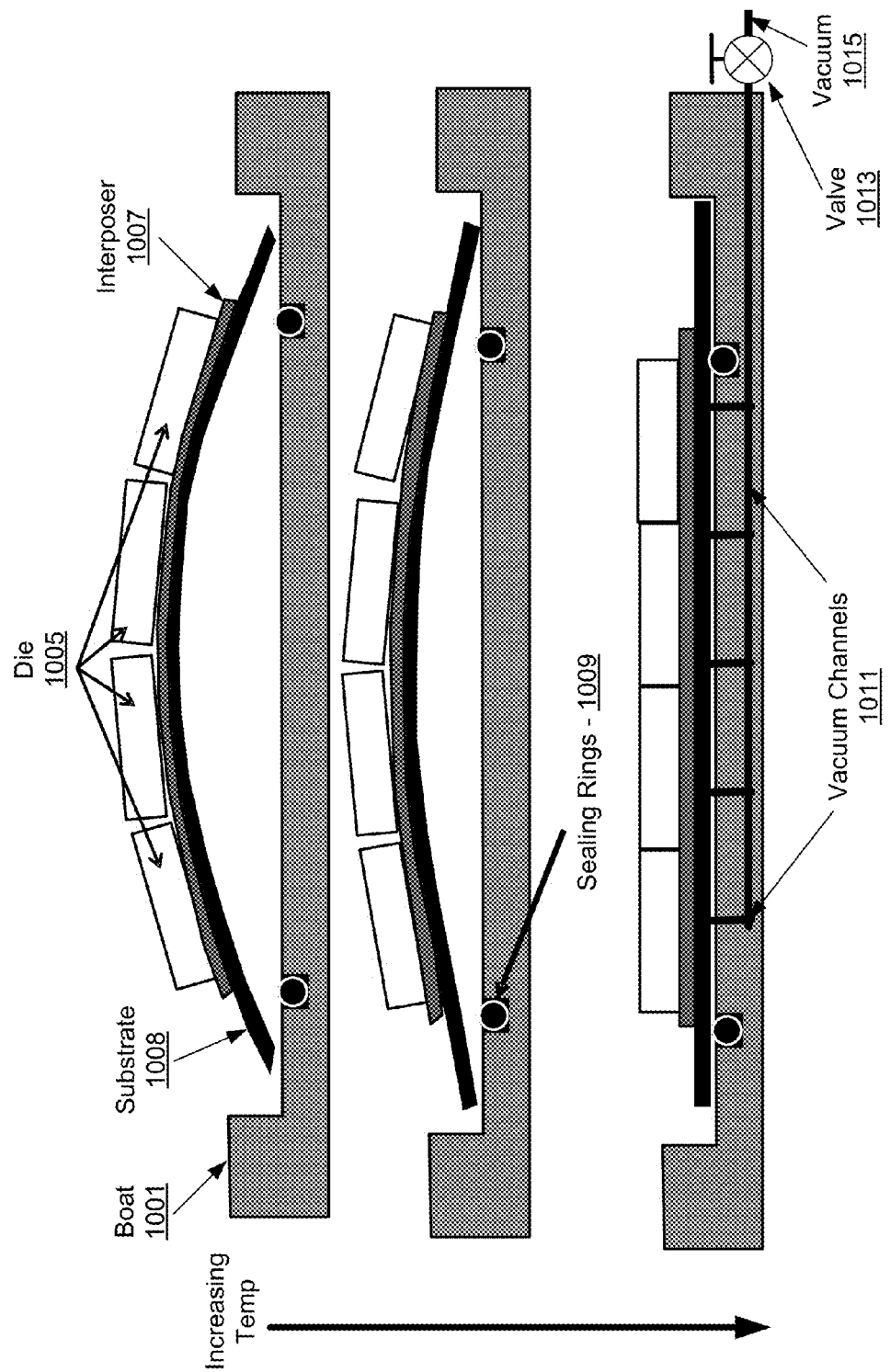
FIG. 10 is a diagram illustrating a vacuum planarizing apparatus, in accordance with an example embodiment of the invention.

FIG. 10 is a diagram illustrating a vacuum planarizing apparatus, in accordance with an example embodiment of the invention. Referring to FIG. 10, there is shown a boat 1001, a plurality of die 1005, an interposer 1007, a substrate 1008, vacuum sealing rings 1009, vacuum channels 1011, a valve 1013, and a vacuum supply 1015.

In an example scenario, the boat 1001 comprises a vacuum system to flatten the partially assembled package comprising the plurality of die 1005, the interposer 1007, and the substrate 1008, which may comprise a packaging substrate, for example. The vacuum-mechanical system permits the partially assembled package to heat up in normal fashion, but when the partially assembled package has become flat, it resists the normal progression of the warpage, holding the partially assembled package in a flattened configuration during heating and then maintains that flatness of the silicon interposer 1007 and the substrate 1008 as temperatures increases.

The vacuum may be applied at room temperatures or slightly elevated temperatures utilizing the vacuum supply 1015 via the valve 1013 and the vacuum channels 1011, and may be held utilizing the high-temperature sealing rings 1009 so that the vacuum-mechanical boat 1001 may travel through a standard reflow furnace and still maintain sufficient vacuum to maintain interposer silicon top surface planarity.

Figures 11A, 11B, 11C:
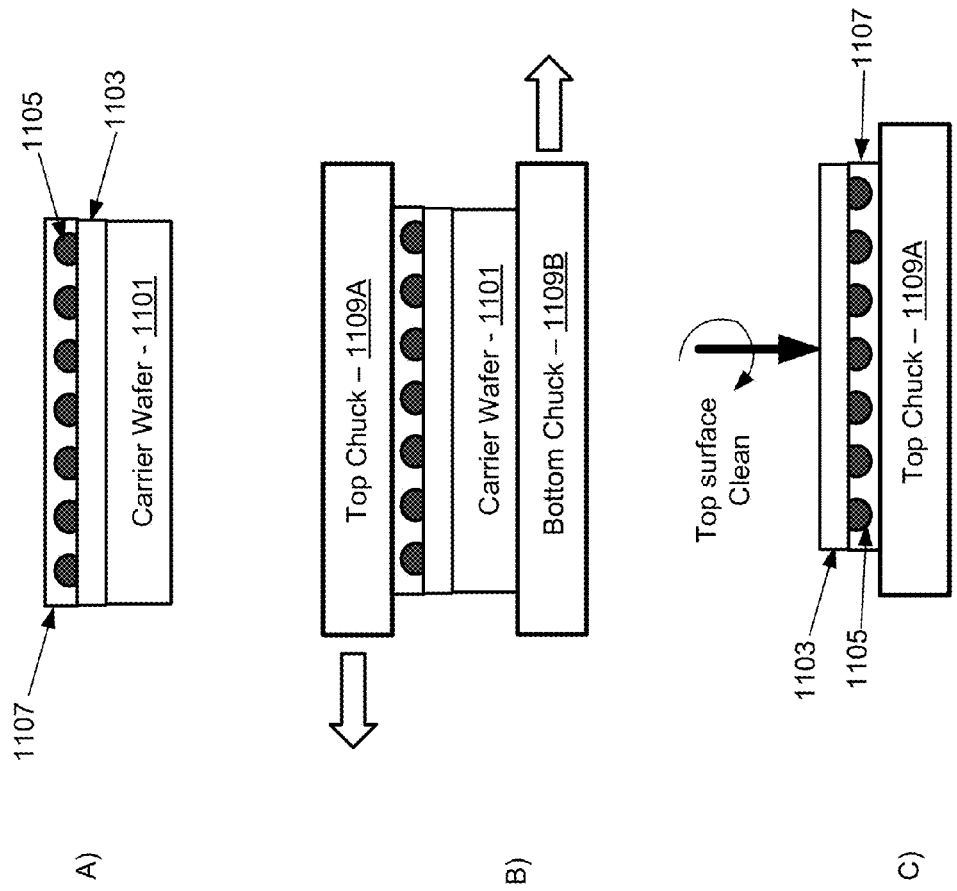
FIGS. 11A-11E illustrate steps for debonding wafers with large backside bumps, in accordance with an example embodiment of the invention.

FIGS. 11A-11E illustrate steps for debonding wafers with large backside bumps, in accordance with an example embodiment of the invention. Referring to FIG. 11A, there is show a carrier wafer 1101, a device wafer 1103 with backside bumps 1105, and a polymer layer 1107.

The device wafer 1103 may comprise an electronics (i.e. functional) wafer or an interposer wafer, for example, which may comprise large backside bumps 1105 that may be susceptible to damage in debond processes. Accordingly, the polymer layer 1107 may be applied to protect the backside bumps 1105 during debond processes. The polymer layer 1107 may comprise a resist material or an adhesive film or tape, for example, that may be applied on the device wafer 1103 over the backside bumps 1105.

A subsequent chuck attachment, such as with a vacuum technique, to the carrier wafer 1101 and the top surface of the polymer layer 1107 is shown in FIG. 11B. The top chuck 1109A may be moved in one lateral direction while the bottom chuck 1109B may be moved in the opposite direction to separate the carrier wafer 1101 from the device wafer 1103. The polymer layer 1107 may enable a proper vacuum seal to the surface, where there may be a poor seal when applied directly to the backside bumps 1105.

FIG. 11C shows the resulting structure following debond from the carrier wafer 1101. Any adhesive residue remaining from the carrier wafer 1101 may be removed in a cleaning process while still attached to the top chuck 1109A.

Figures 11D, 11E:
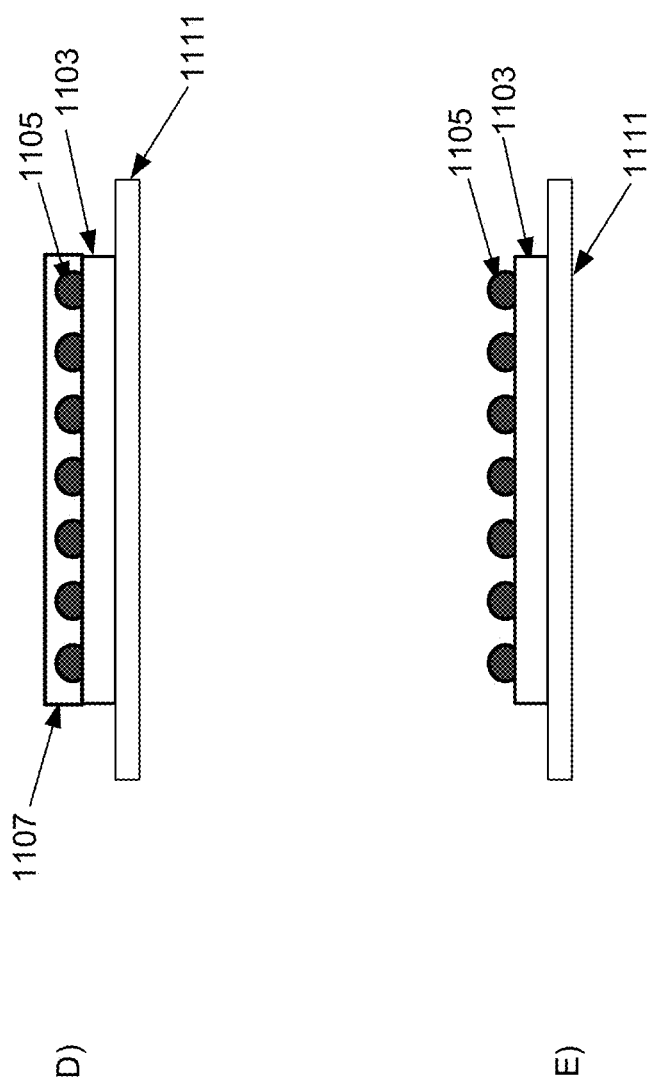

The cleaned structure may then be affixed to a film frame 1111 with the backside bumps 1105 facing up, as shown in FIG. 11D for example. The polymer layer 1107 may then be removed either chemically or thermally followed by a surface clean, resulting in the bonded wafer 1103 shown in FIG. 11E for example.

Figure 12:
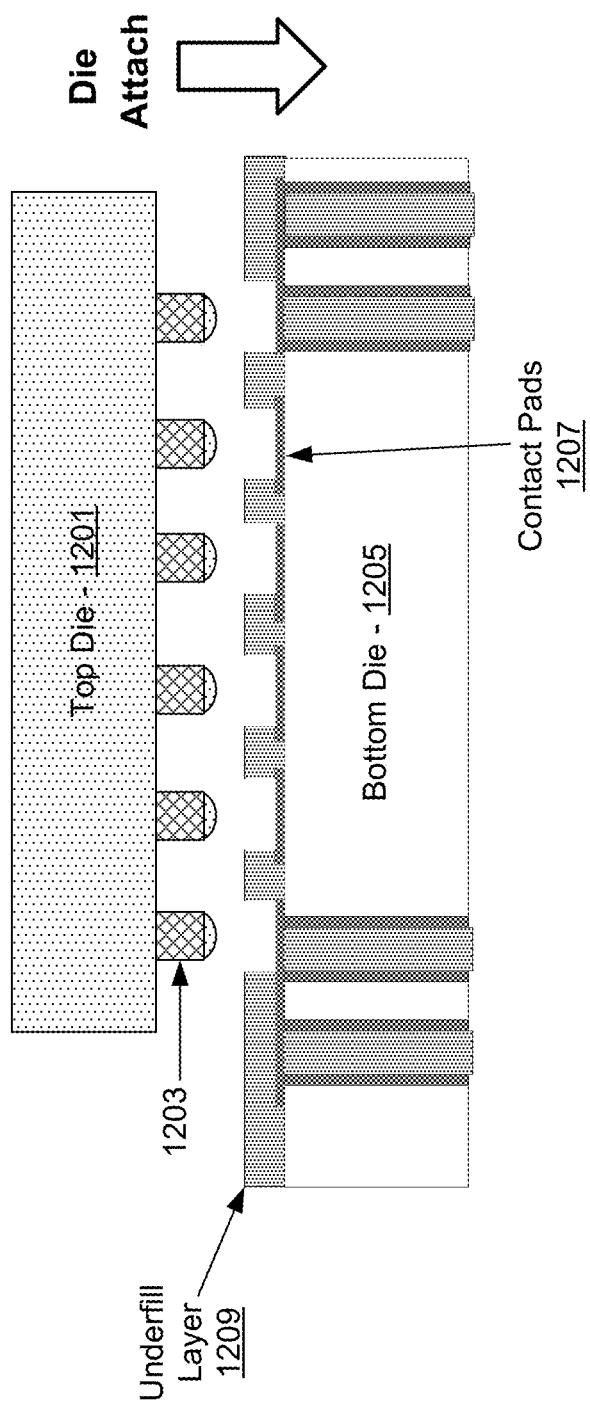
FIG. 12 is a diagram illustrating die-to-die bonding utilizing a patterned underfill layer, in accordance with an example embodiment of the invention.

FIG. 12 is a diagram illustrating die-to-die bonding utilizing a patterned underfill layer, in accordance with an embodiment of the invention. Referring to FIG. 12, there is shown a top die 1201 with microbumps 1203 and a bottom die 1205 comprising contact pads 1207 and an underfill layer 1209.

In an example scenario, the microbumps 1203 may comprise copper pillars, for example, and may correspond to the contact pads 1207 in the bottom die 1205. The underfill layer 1209 may comprise a polymer applied to the top surface of the bottom die 1205 that the next level die, the top die 1201, will be bonded to. The polymer may comprise a re-passivation or pre-applied underfill that will flow and bond to both die surfaces negating the need for subsequent underfill processes.

Furthermore, the underfill layer 1209 may be patterned utilizing photolithography techniques or laser ablation to expose the appropriate contact pads 1207 in the bottom die 1205 (e.g., by forming wells in the layer 1209). The layer 1209 may comprise a film where the openings may comprise full depth pockets or partial depth pockets, for example, generated using laser ablation or photolithography techniques. Material remaining in the partial depth pockets may assist in the bonding process of the top die 1201 to the bottom die 1205, for example.

The exposed pads may be utilized to align the top die 1201 to the bottom die 1205. The die may be bonded utilizing a thermal compression or mass reflow technique, for example. A flux dip may be utilized to aid in wetting of solder from one surface to the other and the underfill may "snap-cure" and seal to both top and bottom die surfaces. Furthermore the underfill may flow around and under the microbumps 1203 and the contact pads 1207 during the bond process.

In an example embodiment of the invention, a method and system are disclosed for a semiconductor device package with a die-to-packing substrate first bond. For purposes of this example, the interposer 107 of FIG. 1A-1B is termed a first die 107. In this regard, aspects of the invention may comprise bonding a first die 107, 801A (e.g., a semiconductor die) to a packaging substrate 103, applying an underfill material 401A, 401B, 803A between the first die 107, 801A and the packaging substrate 103, and bonding one or more additional die 101, 801B to the first die 107, 801A.

The one or more additional die 101, 801B may comprise electronic devices. The first die 107, 801A may be an interposer (as discussed above) or may comprise electronic devices. The first die 107, 801A may be bonded to the packaging substrate 103 utilizing a mass reflow process 303A or a thermal compression process 301B. The one or more additional die 101, 801B may be bonded to the first die 107, 801A utilizing a mass reflow process 303B or a thermal compression process 301B, 307B. The bonded first die and the bonded one or more additional die may be encapsulated in a mold material 821. The mold material 821 may comprise a polymer. The one or more additional die 101, 801B may comprise micro-bumps 109 for coupling to the first die 107, 801A.

The first die 107, 801A may be an interposer (as discussed above) bonded to the packaging substrate 103 utilizing a thermal compression process. The bonding of the one or more additional die 101, 801B may comprise: adhering the one or more additional die 101, 801B to an adhesive layer; and bonding the adhered one or more additional die 101, 801B to the first die 107, 801A.

The bonding of the one or more additional die 101, 801B may comprise: placing the first die 107, 801A and the packaging substrate in a fixture that allows the first die 107, 801A and the packaging substrate to flex in one direction but not in an opposite direction; and processing the first die 107, 801A, the packaging substrate, and the one or more additional die 101, 801B through a reflow process.

Prior to the bonding of the die 107, 801A to the packaging substrate: thinning a first substrate 610, which comprises the first die 107, 801A and is bonded to a support structure 603, to expose through-silicon-vias 115 in said first die 107, 801A; and removing the first interposer 610 from the support structure 603. The removing of the first substrate from the support structure 603 may comprise: forming a protective, polymer layer 1107 over backside bumps 1105 on the first device wafer 1103; attaching a first chuck 1109A to the polymer layer 1107; attaching a second chuck 1109B to the carrier wafer 1101; and causing relative motion between the attached first chuck 1109A and the attached second chuck 1109B.

The bonded first die 107, 801 and the bonded one or more additional die 101, 801B may be encapsulated in a mold material 821. The one or more additional die 101, 801B, 1201 may comprise micro-bumps 109, 1203 for coupling to the first die 107, 801, 1205, wherein the bonding comprises: positioning the micro-bumps 1203 in respective wells in a layer 1209 disposed on the first die 107, 801A, 1205; and bonding the micro-bumps 1203 to the first die 107, 801A.

While the invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims.

What is claimed is:

1. A method for semiconductor packaging, the method comprising:
    bonding a silicon interposer die to a packaging substrate;
    applying an underfill material between said bonded silicon interposer die and said packaging substrate; and
    bonding one or more additional die to said bonded silicon interposer die;
    wherein said one or more additional die comprise electronic devices; and
    wherein said bonding of said one or more additional die comprises:
        adhering said one or more additional die to an adhesive layer; and
        bonding said adhered one or more additional die to the silicon interposer die.

2. The method according to claim 1, wherein:
    said bonding the silicon interposer die to said packaging substrate comprises bonding the silicon interposer die to the packaging substrate utilizing a thermal compression process.

3. The method according to claim 1, comprising
    bonding said one or more additional die to said silicon interposer die utilizing a thermal compression process.

4. The method according to claim 1, wherein
    said bonding of said one or more additional die comprises:
        adhering a plurality of additional die to an adhesive layer; and
        bonding the adhered plurality of additional die to the silicon interposer die.

5. The method according to claim 1, wherein
    said bonding of said one or more additional die comprises:
        placing at least said silicon interposer die and said packaging substrate in a fixture that allows said silicon interposer die and said packaging substrate to flex in one direction but not in an opposite direction; and
        processing said silicon interposer die, said packaging substrate, and said one or more additional die through a reflow process.

6. The method according to claim 1, comprising, prior to said bonding of said silicon interposer die to said packaging substrate:
    thinning a first semiconductor wafer, which comprises said silicon interposer die and is bonded to a support substrate, to expose through-silicon-vias in said silicon interposer die; and
    removing said first semiconductor wafer from said support substrate.

7. The method according to claim 6, wherein
    said removing said first semiconductor wafer from said support substrate comprises:
        forming a protective layer over backside bumps on said first semiconductor wafer;
        attaching a first chuck to said protective layer;
        attaching a second chuck to said support substrate; and
        causing relative motion between said attached first chuck and said attached second chuck.

8. The method according to claim 1, wherein
    said silicon interposer die comprises through-silicon vias.

9. A method for semiconductor packaging, the method comprising:
    generating a semiconductor package, said generating comprising:
        bonding an interposer die to a packaging substrate;
        applying an underfill material between said bonded interposer die and said packaging substrate;
        bonding one or more additional die to said bonded interposer die, wherein said one or more additional die comprise electronic devices; and
        applying an underfill material between said bonded one or more additional die and said bonded interposer die;
    wherein:
        an outer side perimeter of the one or more additional die is unbounded by a laminate structure;
        said one or more additional die comprise micro-bumps for coupling to said interposer die; and
        said bonding one or more additional die to said bonded interposer die comprises:
            positioning said micro-bumps in respective wells in a layer disposed on said interposer die; and
            bonding said micro-bumps to said interposer die.

10. The method according to claim 9, wherein
    a majority of a distance between an outer side perimeter of at least one of the one or more additional die and an outer edge of the semiconductor package comprises the mold material.

11. The method according to claim 1, comprising
    encapsulating said bonded silicon interposer die and said bonded one or more additional die in a mold material such that a majority of a distance between an outer side perimeter of at least one of the one or more additional die and an outer edge of the packaging substrate comprises the mold material.

12. The method according to claim 9, wherein
    the interposer die is devoid of electronic devices and comprises one or more of: silicon, glass, or an organic laminate material.

13. The method according to claim 1, wherein
    the interposer die is devoid of electronic devices and comprises one or more of: silicon, glass, or an organic laminate material.

14. A method for semiconductor packaging, the method comprising:
    thinning a first semiconductor wafer, which comprises a silicon interposer die and is bonded to a support substrate, to expose through-silicon-vias in said silicon interposer die;
    removing said first semiconductor wafer from said support substrate;

bonding the silicon interposer die to a packaging substrate;
applying an underfill material between said bonded silicon interposer die and said packaging substrate; and
bonding one or more additional die to said bonded silicon interposer die, wherein said one or more additional die comprise electronic devices.

15. The method according to claim 14, wherein
said removing said first semiconductor wafer from said support substrate comprises:
  forming a protective layer over backside bumps on said first semiconductor wafer;
  attaching a first chuck to said protective layer;
  attaching a second chuck to said support substrate; and
  causing relative motion between said attached first chuck and said attached second chuck.

16. A method for semiconductor packaging, the method comprising:
bonding a silicon interposer die to a packaging substrate;
applying an underfill material between said bonded silicon interposer die and said packaging substrate; and
bonding one or more additional die to said bonded silicon interposer die;
wherein said one or more additional die comprise an electronic device;
wherein said one or more additional die comprise micro-bumps for coupling to said silicon interposer die; and
wherein said bonding one or more additional die to said bonded silicon interposer die comprises:
  positioning said micro-bumps in respective wells in a layer disposed on said silicon interposer die; and
  bonding said micro-bumps to said silicon interposer die.

17. The method according to claim 16, comprising
forming the respective wells in the layer using one or more of photolithography and/or laser ablation.

18. The method according to claim 17, wherein
said wells are a full depth of the layer.

19. The method according to claim 16, wherein
said wells are partial depth wells in said layer.

20. The method according to claim 16, wherein
the silicon interposer die is devoid of electronic devices.

* * * * *